(12) United States Patent
Chung et al.

(10) Patent No.: US 10,943,783 B2
(45) Date of Patent: Mar. 9, 2021

(54) METHOD FOR MANUFACTURING A SEMICONDUCTOR DEVICE (71) Applicant: TAIWAN SEMICONDUCTOR MANUFACTURING CO., LTD., Hsinchu (TW)

(72) Inventors: Cheng-Che Chung, Hualien County (TW); Yi Jen Tsai, New Taipei (TW); Ching-Sen Kuo, Taipei (TW); Tsai-Ming Huang, Zhubei (TW); Jieh-Jang Chen, Zhubei (TW); Feng-Jia Shiu, Jhudong Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/427,299

(22) Filed: May 30, 2019

(65) Prior Publication Data
US 2020/0075318 A1 Mar. 5, 2020

Related U.S. Application Data (60) Provisional application No. 62/726,085, filed on Aug. 31, 2018.

(51) Int. Cl.
*H01L 21/00* (2006.01)
*G03F 7/20* (2006.01)
*H01L 21/027* (2006.01)
*H01L 21/768* (2006.01)
*G03F 7/32* (2006.01)
*H01L 21/3105* (2006.01)

(52) U.S. Cl.
CPC ........ *H01L 21/0273* (2013.01); *G03F 7/2004* (2013.01); *G03F 7/2006* (2013.01); *G03F 7/322* (2013.01); *H01L 21/31058* (2013.01); *H01L 21/76819* (2013.01); *H01L 21/76877* (2013.01)

(58) Field of Classification Search
CPC .......... H01L 21/0273; H01L 21/76819; H01L 21/76877; H01L 21/31058; G03F 7/2006; G03F 7/2004; G03F 7/322
See application file for complete search history.

(56) References Cited

U.S. PATENT DOCUMENTS

| | | | | |
|---|---|---|---|---|
| 6,754,052 B2* | 6/2004 | Asida | ...................... | B82Y 10/00 360/322 |
| 6,803,291 B1* | 10/2004 | Fu | ...................... | H01L 21/76229 257/797 |
| 7,887,996 B2* | 2/2011 | Liu | ...................... | H01L 21/0334 430/270.1 |
| 2003/0035251 A1* | 2/2003 | Asida | ...................... | B82Y 10/00 360/322 |
| 2004/0185637 A1* | 9/2004 | Fu | ...................... | H01L 21/76229 438/401 |
| 2008/0241734 A1* | 10/2008 | Liu | ...................... | H01L 21/0334 430/253 |

* cited by examiner

Primary Examiner — Nikolay K Yushin
(74) Attorney, Agent, or Firm — McDermott Will & Emery LLP (57) ABSTRACT In a method of manufacturing a semiconductor device, a first layer having an opening is formed over a substrate. A second layer is formed over the first layer and the substrate. A photo resist pattern is formed over the second layer above the opening of the first layer. The photo resist pattern is reflowed by a thermal process. An etch-back operation is performed to planarize the second layer.

20 Claims, 8 Drawing Sheets

METHOD FOR MANUFACTURING A SEMICONDUCTOR DEVICE

RELATED APPLICATION

This application claims priority to U.S. Provisional Patent Application No. 62/726,085 filed Aug. 31, 2018, the entire content of which is incorporated herein by reference.

BACKGROUND

As the semiconductor industry has progressed into nanometer technology process nodes in pursuit of higher device density, higher performance, and lower costs, challenges from both fabrication and design issues become greater. Lithography operations are one of the key operations in the semiconductor manufacturing process. In the lithography operations, flatness or unevenness of the underlying structure is important because of a tight focus margin in the lithography operations. Accordingly, it is necessary to planarize uneven underlying structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

The semiconductor devices include interconnect structures that include a plurality of interconnect pattern (line) layers having conductive patterns and a plurality of contact holes/vias for connecting various features in one portion/feature of a semiconductor chip (die) to other portions/features of the chip. The interconnect and via structures are formed of conductive materials such as metal, and the semiconductor devices include several interconnect layers in various embodiments.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of an inter-metal dielectric (IMD) material is deposited, trenches and vias are formed and filled with a conductive material (e.g., copper or aluminum or various alloys) and the surface is planarized by a planarization operation, such as a resist etch-back process and a chemical mechanical polishing (CMP) process, although other patterning techniques are used in other embodiments. Because of the resolution limit of photolithography processes, multiple patterning lithography processes are used to form densely arranged interconnects and/or vias.

In the lithography operations, flatness of the underlying layer/structure is critical because of a tight focus margin. Accordingly, when the underlying layer/structure is uneven, it is necessary to planarize the unevenness with one or more planarization layers before applying a photo resist.

A resist etch-back operation is one of the planarization operations. After a film, such as a dielectric film, is formed over an uneven surface, such as a gate structure, a fin structure and/or a wiring structure, a photo resist layer is coated on the film. The photo resist layer is then exposed to an exposure light (e.g., deep ultra violet (DUV) light or extreme ultra violet (EUV) light) and exposed photo resist layer is developed to form a resist pattern. In the etch-back process, the resist pattern remains in an area having a lower surface height. Then, the resist pattern and the underlying film are preferentially etched together to remove a thick portion of the film.

However, when there is a space between a high portion of an uneven surface and the resist pattern or an overlap between the high portion of the uneven surface and the resist pattern, a gap or a protrusion may occur after the etch-back process. The embodiments of the present disclosure resolve such a problem.

FIGS. 1-8B show views of the various stages of a sequential semiconductor device manufacturing process according to embodiments of the present disclosure. It is understood that additional operations can be provided before, during, and after processes shown by FIGS. 1-8B, and some of the operations described below can be replaced or eliminated, for additional embodiments of the method. The order of the operations/processes may be interchangeable. In FIGS. 4A-6B, 8A and 8B, the "A" figures show cross sectional views and the "B" figures show top views (plan views).

Figure 1:
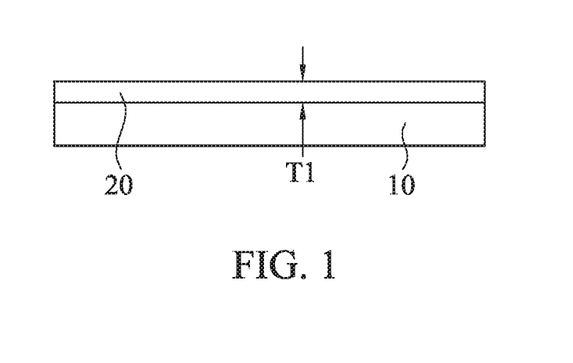
FIG. 1 shows a cross sectional view of one of the various stages of a sequential semiconductor device manufacturing process according to an embodiment of the present disclosure.

As shown in FIG. 1, a first layer 20 is formed over an underlying layer 10. In some embodiments, the underlying layer 10 is a semiconductor substrate. In one embodiment, the substrate 10 is a silicon substrate. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate. The substrate may include various regions that have been suitably doped with impurities (e.g., p-type or n-type conductivity).

In other embodiments, the underlying layer 10 includes one or more layers of a dielectric material or a conductive material. The dielectric material includes silicon oxide, silicon nitride, silicon oxynitride (SiON), SiOCN, SiCO, SiCN, fluorine-doped silicate glass (FSG), or a low-k dielectric material, or any other suitable dielectric materials. The dielectric material layer may be formed by chemical vapor deposition (CVD), physical vapor deposition (PVD), atomic layer deposition (ALD), or other suitable film forming processes. In some embodiments, after the dielectric layer is formed, a planarization process, such as an etch back process and/or a chemical mechanical polishing (CMP) process is performed on the dielectric layer.

The conductive material includes a semiconductor material, such as an elementary semiconductor including silicon or germanium; Group IV-IV compound semiconductors; or Group III-V compound semiconductors as set forth above. The semiconductor material can be poly crystalline, amorphous or crystalline. The conductive material also includes metallic material, such as Al, Cu, AlCu, W, Co, Ti, Ta, Ni, a silicide, TiN or TaN, or any suitable materials. The conductive material can be formed by CVD, PVD, ALD, molecular beam epitaxy (MBE), electro plating, or other suitable film forming processes.

In some embodiments, the first layer 20 includes one or more layers of a dielectric material or a conductive material. The dielectric material for the first layer 20 includes silicon oxide, silicon nitride, silicon oxynitride (SiON), SiOCN, SiCO, SiCN, fluorine-doped silicate glass (FSG), or a low-k dielectric material, or any other suitable dielectric materials. The conductive material for the second layer includes metallic material, such as Al, Cu, AlCu, W, Co, Ti, Ta, Ni, Mo, or alloy thereof, a silicide, TiN or TaN, or any suitable materials. The first layer 20 can be formed by CVD, PVD, ALD, molecular beam epitaxy (MBE), electro plating, or other suitable film forming processes. In some embodiments, the first layer 20 is a metal or metallic layer.

Figure 2:
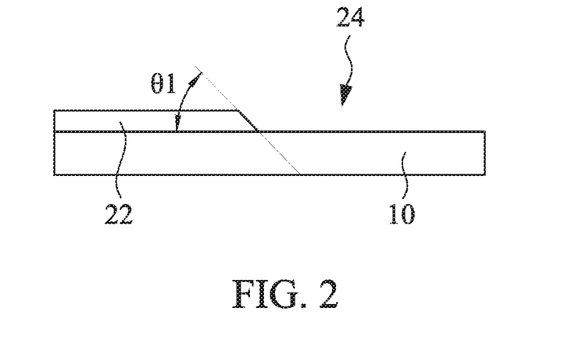
FIG. 2 shows a cross sectional view of one of the various stages of a sequential semiconductor device manufacturing process according to an embodiment of the present disclosure.

After the first layer 20 is formed, by using one or more lithography and etching operations, the first layer 20 is patterned to have one or more first layer patterns 22 and one or more openings 24, as shown in FIG. 2. In the opening 24, the underlying layer 10 is exposed.

A thickness T1 of the first layer 20, when made of a conductive material, is in a range from about 10 nm to about 1000 nm in some embodiments, and is in a range from about 50 nm to about 500 nm in other embodiments. The thickness T1 of the first layer 20, when made of a dielectric material, is in a range from about 50 nm to about 2000 nm in some embodiments, and is in a range from about 100 nm to about 500 nm in other embodiments. In some embodiments, an edge of the first layer pattern 22 has a slope. In some embodiments, the slope angle θ1 measured from the upper surface of the underlying layer 10 is in a range from about 45° to about 90° and is in a range from about 70° to about 85° in other embodiments.

Figure 3:
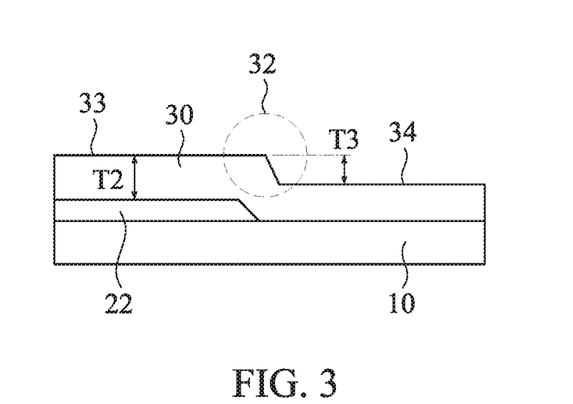
FIG. 3 shows a cross sectional view of one of the various stages of a sequential semiconductor device manufacturing process according to an embodiment of the present disclosure.

Then, as shown in FIG. 3, a second layer 30 is formed over the patterned first layer 20 and the underlying layer 10. In some embodiments, the second layer 30 includes one or more layers of a dielectric material or a conductive material. When the first layer 20 is made of a dielectric material, the second layer 30 is made of a conductive material, and when the first layer 20 is made of a conductive material, the second layer 30 is made of a dielectric material, in some embodiments. The dielectric material for the second layer 30 includes silicon oxide, silicon nitride, silicon oxynitride (SiON), SiOCN, SiCO, SiCN, fluorine-doped silicate glass (FSG), or a low-k dielectric material, or any other suitable dielectric materials. The conductive material includes metallic material, such as Al, Cu, AlCu, W, Co, Ti, Ta, Ni, Mo, or alloy thereof, silicide, TiN or TaN, or any suitable materials. The second layer 30 can be formed by CVD, PVD, ALD, molecular beam epitaxy (MBE), electro plating, or other suitable film forming processes. In one embodiments, the second layer 30 is a dielectric material layer. A thickness T2 of the second layer 30 when made of a dielectric material, is in a range from about 50 nm to about 2000 nm in some embodiments, and is in a range from about 100 nm to about 500 nm in other embodiments. The thickness T2 of the second layer 30, when made of a conductive material, is in a range from about 10 nm to about 1000 nm in some embodiments, and is in a range from about 50 nm to about 500 nm in other embodiments.

As shown in FIG. 3, a step 32 caused by the first layer pattern 22 is formed in the second layer 30 between an upper surface 33 above the first layer pattern 22 and a lower surface 34 above the opening 24 of the first layer 20. The height T3 of the step 32 is substantially equal to the thickness of the first layer 20 in some embodiments.

Figure 4A:
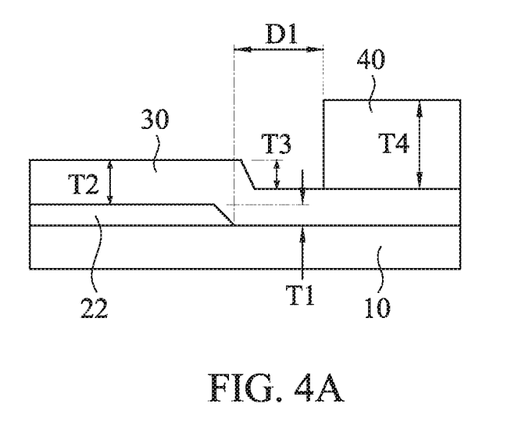
FIG. 4A shows a cross sectional view and FIG. 4B shows a schematic plan view of one of the various stages of a sequential semiconductor device manufacturing process according to an embodiment of the present disclosure.
Figure 4B:
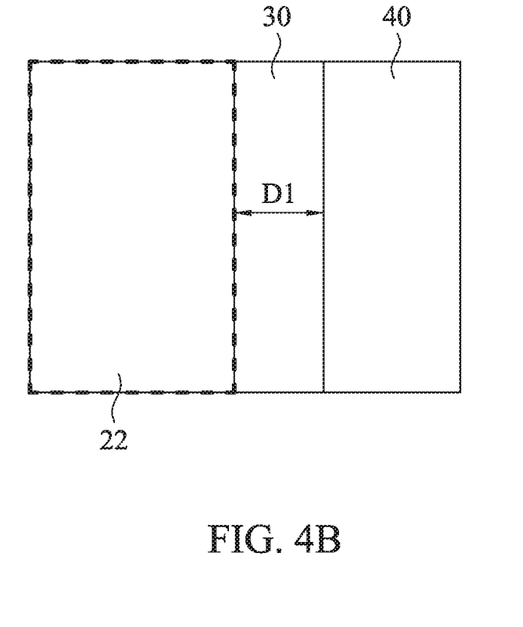

Then, by using one or more lithography operations, a photo resist pattern 40 is formed over the second layer 30 above the opening 24 of the first layer 20, as shown in FIGS. 4A and 4B. In FIG. 4B, the underlying first layer pattern 22, which is covered by the second layer 30 is shown.

The photo resist layer is a photosensitive layer that is patterned by exposure to actinic radiation. Typically, the chemical properties of the photoresist regions struck by incident radiation change in a manner that depends on the type of photoresist used. A photo resist layer is typically a positive resist or a negative resist. The positive resist refers to a photoresist material that when exposed to radiation (typically UV light) becomes soluble in a developer, such as a tetramethylammonium hydroxide (TMAH) solution, while the region of the photoresist that is non-exposed (or exposed less) is insoluble in the developer. Negative resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

In some embodiments, the photo resist is a chemically amplified photo resist. When a positive tone chemically amplified resist is used, acid generated by the exposure light from a photo acid generator (PAG) in the photo resist cleaves acid-cleavable polymers in the photo resist during the post-exposure baking. After the acid cleaves the polymer, the polymer becomes more hydrophilic (i.e., soluble in an aqueous developer). After the polymer becomes more hydrophilic, the polymer cannot be dissolved by organic solvent, for example, normal butyl acetate, but can be dissolved by a basic solution, for example, 2.38% tetramethylammonium hydroxide (TMAH) solution.

When a negative tone chemically amplified resist is used, acid generated by the exposure light from a photo acid generator (PAG) in the photo resist catalyzes a cross-linking reaction of acid catalyzed cross linkable polymer in the photo resist or causes polymeric pinacol in the photo resist to undergo pinacol rearrangement, during the post-exposure baking. After the polymer cross linking or the undergoing of pinacol rearrangement, the polymers become more hydrophobic. After the polymer become more hydrophobic, the polymers are not dissolved by a basic developing solution, for example, 2.38% TMAH solution.

In some embodiments, the photo resist includes one or more polymer resins and a photo active compound (PAC). In some embodiments, the polymer resin includes a hydrocarbon structure (such as an alicyclic hydrocarbon structure) that contains one or more groups that will decompose (e.g., acid labile groups or acid leaving groups) or otherwise react when mixed with acids, bases, or free radicals generated by the PACs. In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth) acrylonitrile, (meth)acrylamides, styrenes, vinyl ethers, combinations of these, or the like.

The PACs are photoactive components, such as photoacid generators (PAGs), photobase generators, free-radical generators, or the like. The PACs may be positive-acting or negative-acting. In some embodiments, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. The group which will decompose, otherwise known as a leaving group or, in some embodiments in which the PAC is a photoacid generator (PAG), an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like. Other suitable materials are included in a photo sensitive silicon containing layer.

A photo resist layer is spin-coated on the second layer 30, and the photo resist layer is exposed with an exposure light/beam through a photo mask. The exposure light/beam can be deep ultra violet (DUV) light, such as KrF excimer laser light and ArF excimer laser light, extreme ultra violet (EUV) light having a wavelength around 13.5 nm, an X-ray, and/or electron beam. In some embodiments, multiple exposure processes are applied. After development of the exposed photo resist, the photo resist pattern 40 is obtained.

A thickness T4 of the photo resist pattern 40 is in a range from about 100 nm to about 1000 nm in some embodiments, and is in a range from about 200 nm to about 700 nm in other embodiments. A distance D1 between the edge of the first layer pattern 22 (closest to the photo resist pattern 40) and the edge of the photo resist pattern 40 (closest to the first layer pattern 22) is in a range from about 100 nm to about 2000 nm in some embodiments, and is in a range from about 600 nm to about 1000 nm in other embodiments.

Figure 5A:
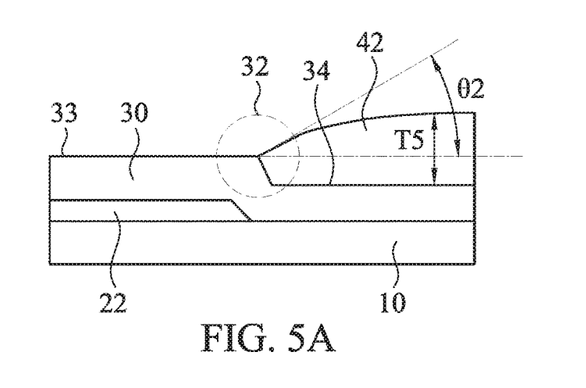
FIG. 5A shows a cross sectional view and FIG. 5B shows a schematic plan view of one of the various stages of a sequential semiconductor device manufacturing process according to an embodiment of the present disclosure.
Figure 5B:
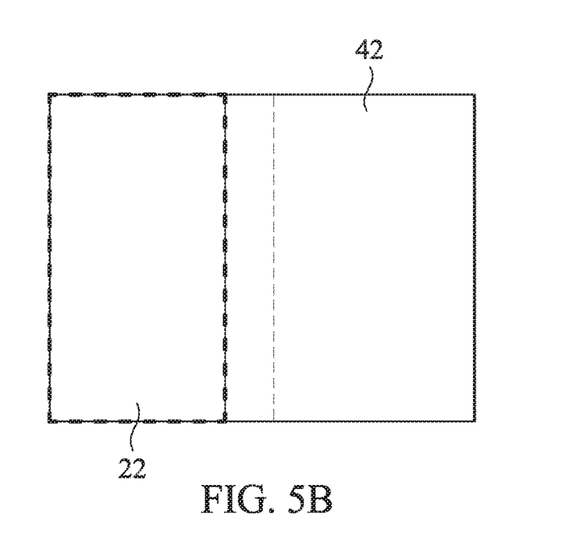

Then, as shown in FIGS. 5A and 5B, the photo resist pattern 40 is subjected to a thermal reflow process. The substrate with the photo resist pattern 40 is heated at a temperature in a range from about 150° C. to about 200° C. in some embodiments, and in a range from about 170° C. to about 180° C. in other embodiments. The reflow process is performed by using a hot plate, on which the substrate is placed, in some embodiments. The reflow time is in a range from about 30 seconds to about 120 seconds in some embodiments, and is in a range from about 40 seconds to about 80 seconds in other embodiments. The photo resist has a glass transition temperature in a range from about 80° C.

to about 100° C. in some embodiments. In other embodiments, the reflow process is an infrared lamp annealing process.

After the thermal reflow process, the edge of the reflowed photo resist pattern 42 is located at near the edge of the first layer pattern 22, as shown in FIGS. 5A and 5B. Due to a surface tension of the flowing photo resist, reflowing the photo resist pattern 40 substantially stops at the step 32 formed in the second layer 30 caused by the first layer pattern 22, in a self-aligning manner. Thus, no reflowed photo resist is disposed over the upper surface 33 of the second layer 30 above the first layer pattern 22 in some embodiments. In some embodiments, the reflowed photo resist pattern 42 fully covers the sidewall of the step 32. In other embodiments, an upper portion (e.g., 0-20% of the step height) of the sidewall of the step 32 is not covered by the reflowed photo resist pattern 42.

Figure 5C:
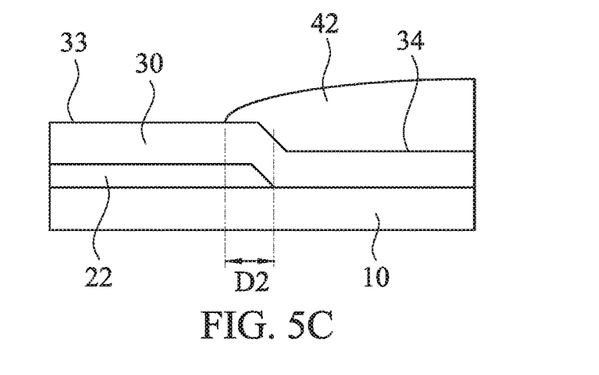
FIG. 5C shows a cross sectional view of one of the various stages of a sequential semiconductor device manufacturing process according to another embodiment of the present disclosure.

In other embodiments, the reflowed photo resist 42 is disposed over the upper surface 33 of the second layer 30 above the first layer pattern 22, as shown in FIG. 5C. In some embodiments, a lateral end of the reflowed photo resist 42 is located just above the sidewall of the edge portion of the first layer pattern 22. In other embodiments, the lateral end of the reflowed photo resist 42 is located over the flat surface of the first layer pattern 22. A distance D2 between the edge of the first layer pattern 22 and the lateral end of the reflowed photo resist pattern 42 is in a range from about 10 nm to about 500 nm in some embodiments, and is in a range from about 50 nm to about 200 nm in other embodiments.

In some embodiments, the reflowed photo resist pattern 42 after the reflow process overlaps the first layer pattern 22 in plan view. The overlap amount is in a range from about 10 nm to about 200 nm in some embodiments, and is in a range from about 10 nm to about 100 nm in other embodiments. In some embodiments, the edge of the reflowed photo resist pattern 42 after the reflow process is spaced apart from the edge of the first layer pattern 22 in plan view. A distance between the edge of the reflowed photo resist pattern 42 and the edge of the first layer pattern 22 is in a range from about 10 nm to about 200 nm in some embodiments, and is in a range from about 20 nm to about 100 nm in other embodiments.

In some embodiments, the reflow amount, which is a distance between the original edge of the photo resist pattern 40 shown in FIG. 4A and the lateral end of the reflowed photo resist 42 shown in FIG. 5A or 5C is in a range from about 100 nm to about 2000 nm, and is in a range from about 600 nm to about 1000 nm in other embodiments.

As shown in FIG. 5A, the tangent line and the line parallel to the surface of the underlying layer 10 or the substrate (horizontal line) has an angle θ2 at the step 32. In some embodiments, the angle θ is in a range from about 5° to about 30°, and is in a range from about 10° to about 20° in other embodiments.

Figure 6A:
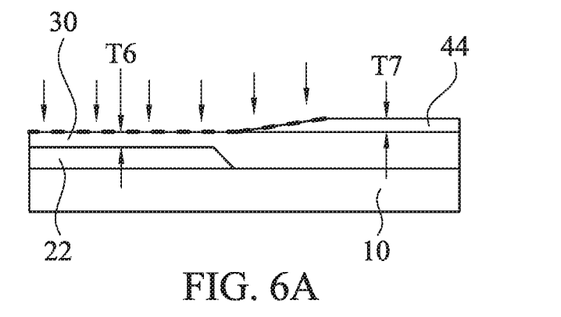
FIG. 6A shows a cross sectional view and FIG. 6B shows a schematic plan view of one of the various stages of a sequential semiconductor device manufacturing process according to an embodiment of the present disclosure.
Figure 6B:
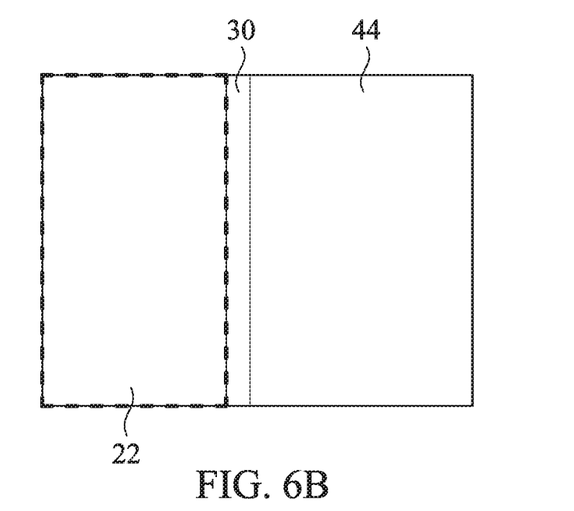

Then, as shown in FIGS. 6A and 6B, one or more etching operations are performed to planarize the second layer 30. The etching operation (i.e., an etch-back operation) includes plasma dry etching in some embodiments. The etch-back operation is performed such that an etching rate of the reflowed photo resist pattern 42 is faster than an etching rate of the second layer 30 in some embodiments. The etching condition may be changed during the etch-back operation.

As shown in FIG. 6A, the etching is stopped when the height of the second layer 30 over the first layer pattern 22 is substantially equal to, e.g., ±10% of, the height of the second layer 30 above the opening 24 of the first layer 20. In some embodiments, a residual photo resist pattern 44 remains, which is removed after the etch-back operation by one or more resist ashing and/or cleaning operations.

Figure 7:
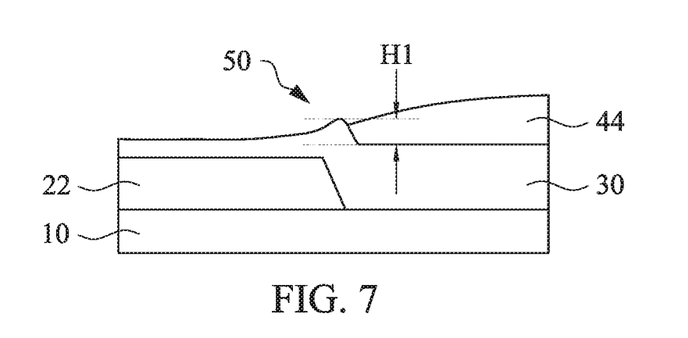
FIG. 7 shows a cross sectional view of one of the various stages of a sequential semiconductor device manufacturing process according to an embodiment of the present disclosure.

After the etch-back operation (planarization etching), in some embodiments, a protrusion 50 of the second layer having a height H1 is formed, as shown in FIG. 7. The height H1 is in a range from about 10 nm to about 100 nm in some embodiments, and is in a range from about 30 nm to about 60 nm in other embodiments. In some embodiments, the protrusion is asymmetric as shown in FIG. 7 in the cross section. For example, one side has a smooth gradual slope and the other side has a steep slope in some embodiments.

Figure 8A:
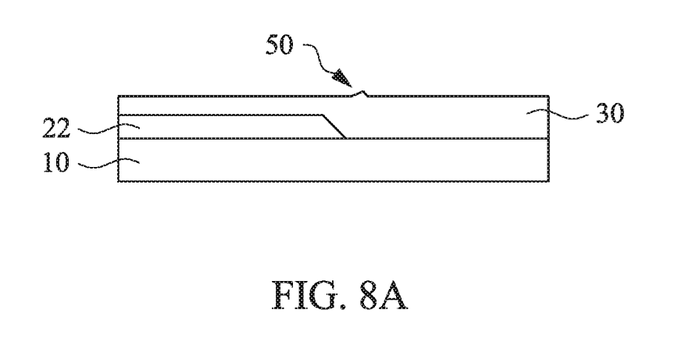
FIG. 8A shows a cross sectional view and FIG. 8B shows a schematic plan view of one of the various stages of a sequential semiconductor device manufacturing process according to an embodiment of the present disclosure.
Figure 8B:
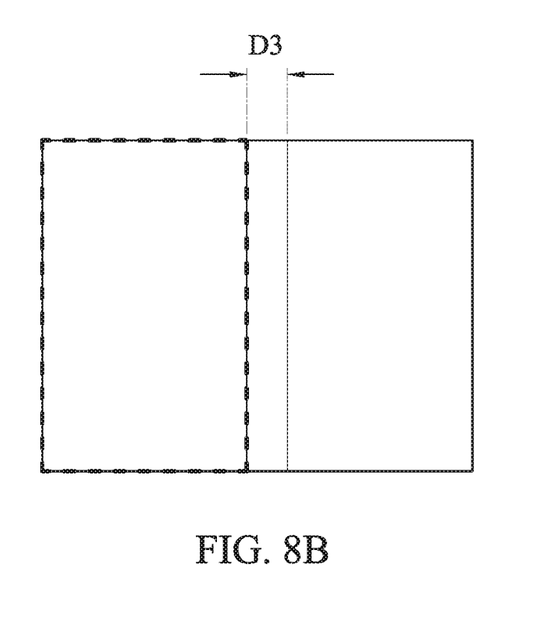

FIGS. 8A and 8B show the structure after the residual photo resist layer 44 is removed. In some embodiments, the protrusion 55 has a line shape along the edge of the first layer pattern 22 in plan view, as shown in FIG. 8B. In some embodiments, a distance D3 between the edge of the first layer pattern 22 and the top (apex) of the protrusion 50 is in a range from about 0 nm to about 100 nm in some embodiments, and is in a range from about 10 nm to about 50 nm in other embodiments. In some embodiments, the top of the protrusion 50 is located above the first layer pattern 22. In certain embodiments, the top of the protrusion 50 is located above the sidewall of the edge portion of the first layer pattern 22. In some embodiments, one or more additional planarization operations, such as an etch-back operation and a CMP operation, are performed to remove the protrusion or to reduce the height of the protrusion.

Figure 9:
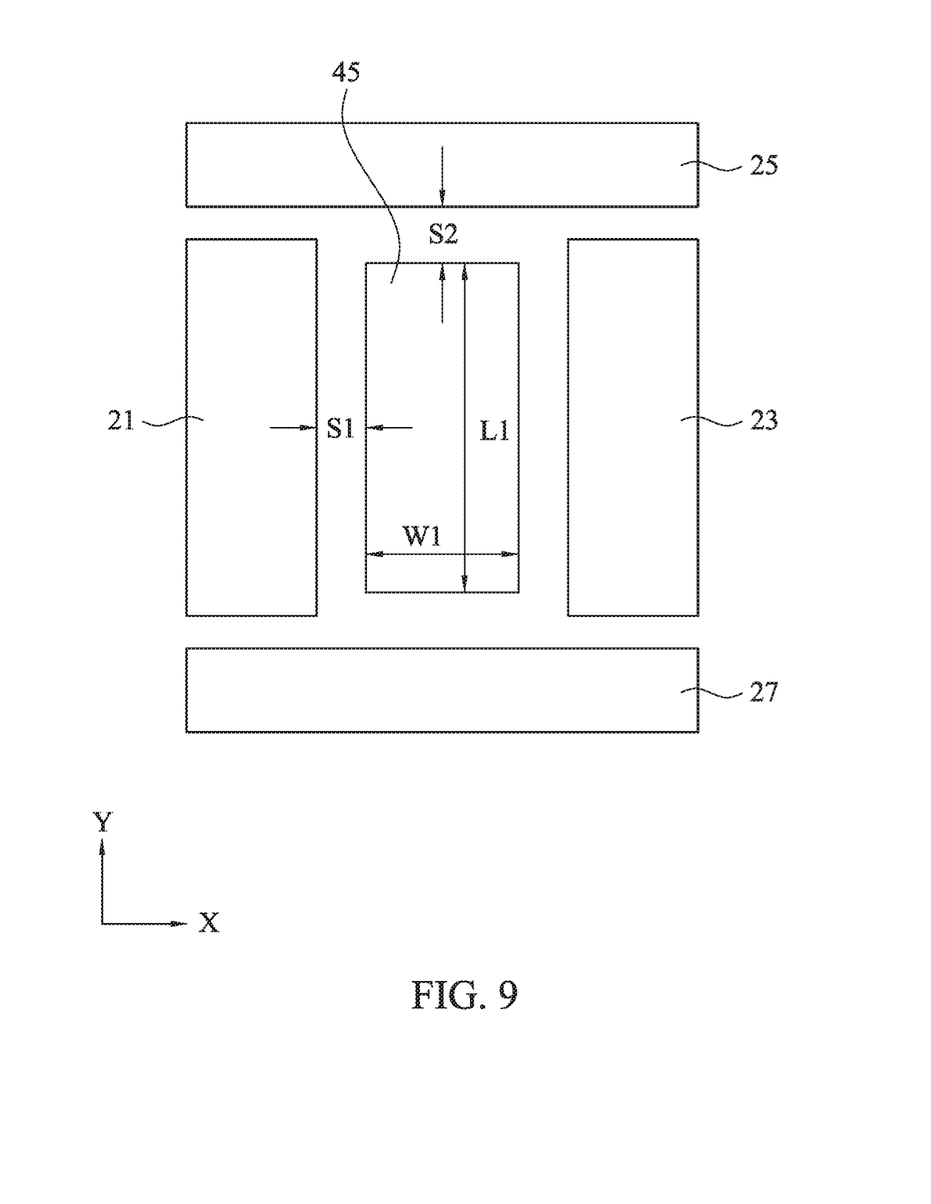
FIGS. 9 and 10 show plan views of one of the various stages of a sequential semiconductor device manufacturing process according to embodiments of the present disclosure.

FIG. 9 shows a plan view of a pattern layout according to an embodiment of the present disclosure. As shown in FIG. 9, the first layer includes four first layer patterns 21, 23, 25 and 27. An opening is formed by the first layer patterns 21, 23, 25 and 27 surrounding the center area. The photo resist pattern 45 is formed in the opening surrounded by the first layer patterns.

In some embodiments, the photo resist pattern 45 has a rectangular shape having a short side width W1 (along the X direction) and a long side length L1 (along the Y direction) as shown in FIG. 9 (W1<L1). Further, as designed, a space having a distance S1 is formed between the long side of the photo resist pattern 45 and the first layer pattern 21 (or 23), and a space having a distance S2 is formed between the short side of the photo resist pattern 45 and the first layer pattern 25 (or 27), as shown in FIG. 9. In some embodiments, S1 is different from S2 and in certain embodiments, S1 is smaller than S2.

Figure 10:
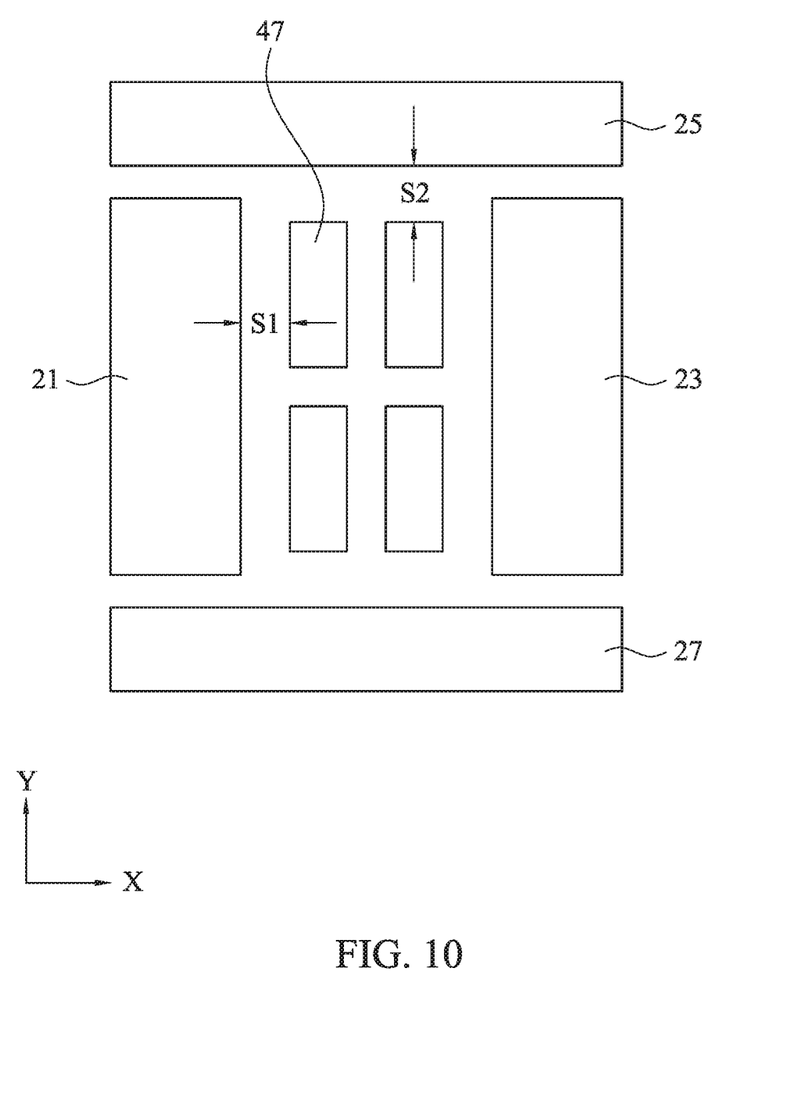

FIG. 10 shows a plan view of a pattern layout according to another embodiment of the present disclosure. As shown in FIG. 10, the first layer 20 includes four first layer patterns 21, 23, 25 and 27. An opening is formed by the first layer patterns 21, 23, 25 and 27 surrounding the center area. The photo resist pattern 47 is formed in the opening surrounded by the first layer patterns. In this embodiment, the photo resist pattern 47 formed in one opening has multiple patterns. In some embodiments, the photo resist pattern 47 includes n×m matrix pattern, where n and m are natural numbers and n×m≠1. Distances of spaces between adjacent multiple patterns are equal to or smaller than a half of either of S1 or S2 based on the directions of the spaces in some embodiments. In some embodiments, a distances of a space between adjacent patterns along the X direction is equal to or smaller than a half of the distance S1, and a distances of a space between adjacent patterns along the Y direction is equal to or smaller than a half of the distance S2.

Figure 11:
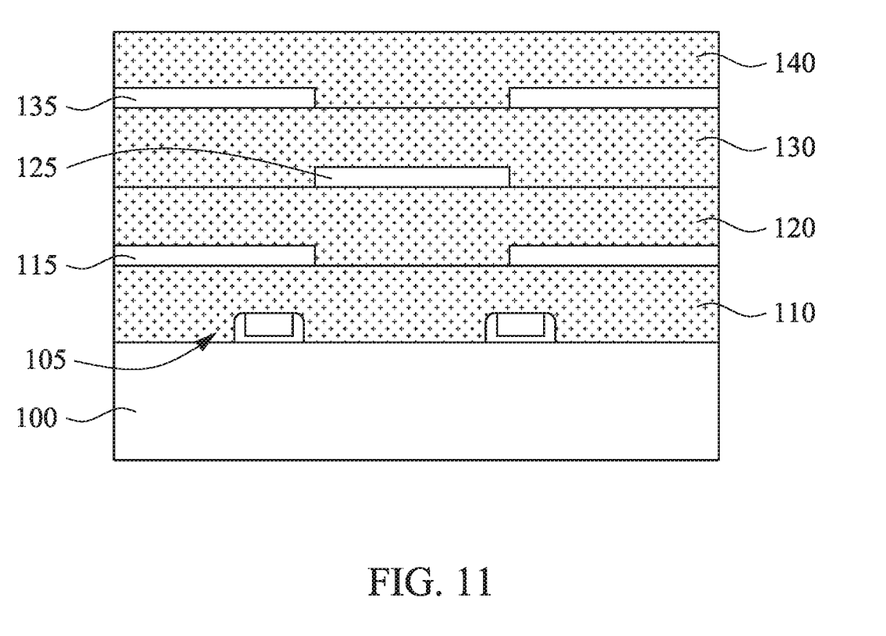
FIG. 11 shows a cross sectional view of a semiconductor device according to embodiments of the present disclosure.

FIG. 11 shows a cross sectional view of a semiconductor device according to embodiments of the present disclosure.

As shown in FIG. 11, one or more underlying electronic devices 105 are formed over a substrate 100. In some embodiments, the substrate 100 is a silicon substrate. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate. In some embodiments, the underlying electronic devices 105 are transistors, such as planar transistors, fin field effect transistors and gate-all-around transistors.

As shown in FIG. 11, a first interlayer dielectric (ILD) layer 110 is formed over the underlying electronic devices 105. Then, first conductive wiring patterns 115 are formed on or in the upper surface of the first ILD layer 110. One or more vias (not shown) are formed in the first ILD layer 110. Then, a second ILD layer 120 is formed over the first conductive wiring patterns 125. Then, second conductive wiring patterns 125 are formed on or in the upper surface of the second ILD layer 120. Further, a third ILD layer 130 is formed over second conductive wiring patterns 125. Then, third conductive wiring patterns 135 are formed on or in the upper surface of the third ILD layer 130. Further, a fourth ILD layer 140 is formed over third conductive wiring patterns 135. Forming an ILD layer and conductive wiring patterns is repeated, thereby forming the n-th ILD layer, where 4<n<20 in some embodiments.

The ILD layers include silicon oxide, SiOCN, SiCO, SiCN, fluorine-doped silicate glass (FSG), or a low-k dielectric material, or any other suitable dielectric materials. The ILD layers may be formed by chemical vapor deposition (CVD), physical vapor deposition (PVD), atomic layer deposition (ALD), or other suitable film forming processes. The conductive wiring patterns include metallic material, such as Al, Cu, AlCu, W, Co, Ti, Ta, Ni, silicide, TiN or TaN, or any suitable materials. The conductive material can be formed by CVD, PVD, ALD, molecular beam epitaxy (MBE), electro plating, or other suitable film forming processes.

In some embodiments of the present disclosure, after at least one of the ILD layers is formed, the aforementioned planarization operation using reflowed photo resist pattern is performed to planarize the given ILD layer. In some embodiments, one or more line-shaped protrusions as describe above are formed on the upper surface of the ILD layer. Further, in some embodiments, the conductive wiring pattern subsequently formed on the ILD layer covers at least a part of the line-shaped protrusions.

It will be understood that not all advantages have been necessarily discussed herein, no particular advantage is required for all embodiments or examples, and other embodiments or examples may offer different advantages.

According to the embodiments of the present disclosure, it is possible to obtain a higher flatness after a resist etch-back operation. Since the self-align reflow process is utilized, more overlay margin between the photo resist pattern for the resist etch-back and the underlying pattern can be obtained.

In accordance with one aspect of the present disclosure, in a method of manufacturing a semiconductor device, a first layer having an opening is formed over a substrate. A second layer is formed over the first layer and the substrate. A photo resist pattern is formed over the second layer above the opening of the first layer. The photo resist pattern is reflowed by a thermal process. An etch-back operation is performed to planarize the second layer. In one or more of the foregoing and following embodiments, the thermal process is performed at a temperature in a range from 150° C. to 200° C. In one or more of the foregoing and following embodiments, the thermal process is performed at a temperature in a range from 170° C. to 180° C. In one or more of the foregoing and following embodiments, the thermal process is performed for a time duration in a range from 30 seconds to 120 seconds. In one or more of the foregoing and following embodiments, the thermal process is performed for a time duration in a range from 40 seconds to 80 seconds. In one or more of the foregoing and following embodiments, after the second layer is formed, a step is formed in the second layer due to an edge of the opening of the first layer, and after the photo resist pattern is reflowed, the reflowed photo resist pattern contacts the step. In one or more of the foregoing and following embodiments, after the photo resist pattern is reflowed, the reflowed photo resist pattern fully covers a side wall of the step. In one or more of the foregoing and following embodiments, a slope of a steepest portion of the reflowed photo resist pattern in contact with the side wall is in a range from 10° to 20° with respect to a surface of the substrate. In one or more of the foregoing and following embodiments, the second layer comprises a upper surface and a lower surface connected by the step, the photo resist pattern is formed on the lower surface and no photo resist pattern is formed on the upper surface, and after the photo resist pattern is reflowed, no reflowed photo resist pattern is disposed on the upper surface. In one or more of the foregoing and following embodiments, a distance between an edge of the opening of the first layer closest to the photo resist pattern and an edge of the photo resist pattern closest to the edge of the opening of the first layer is in a range from 100 nm to 2000 nm in plan view. In one or more of the foregoing and following embodiments, the distance is in a range from 200 nm to 800 nm in plan view. In one or more of the foregoing and following embodiments, after the reflowing, the reflowed photo resist pattern overlaps the first layer by an overlap amount. In one or more of the foregoing and following embodiments, the overlap amount is in a range from 10 nm to 200 nm. In one or more of the foregoing and following embodiments, the overlap amount is in a range from 20 nm to 100 nm. In one or more of the foregoing and following embodiments, after the reflowing, the reflowed photo resist pattern is spaced apart from the first layer by a distance in plan view. In one or more of the foregoing and following embodiments, the distance is in a range from 10 nm to 200 nm. In one or more of the foregoing and following embodiments, the distance is in a range from 20 nm to 100 nm. In one or more of the foregoing and following embodiments, after the etch-back operation, a protrusion of the second layer having a height in a range from 10 nm to 100 nm is formed. In one or more of the foregoing and following embodiments, wherein the protrusion is asymmetric in a cross section.

In accordance with another aspect of the present disclosure, in a method of manufacturing a semiconductor device, in a method of manufacturing a semiconductor device, a first layer having first layer patterns and an opening surrounded by the first layer patterns is formed over a substrate. A second layer is formed over the first layer and the substrate. A photo resist pattern is formed over the second layer above the opening of the first layer. The photo resist pattern is reflowed by a thermal process. An etch-back operation is performed to planarize the second layer. The photo resist pattern has a rectangular shape having a long side and a short side, and a distance between the long side and one of the first layer pattern facing the long side is greater than a distance between the short side and one of the first layer pattern facing the short side.

In accordance with one aspect of the present disclosure, in a method of manufacturing a semiconductor device, a plurality of first metal wiring patterns are formed over a first dielectric layer. A second dielectric layer is formed over the first metal wiring patterns. A photo resist pattern is formed over the second dielectric layer. The photo resist pattern is reflowed by a thermal process. An etch-back operation is performed to planarize the second dielectric layer. A plurality of second metal wiring patterns are formed over the planarized second dielectric layer. The photo resist pattern is formed over the second dielectric layer at a region under which no first metal wiring pattern is formed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first layer having an opening over a substrate;
    forming a second layer over the first layer and the substrate;
    forming a photo resist pattern over the second layer above the opening of the first layer;
    reflowing the photo resist pattern by a thermal process; and
    performing an etch-back operation to planarize the second layer,
    wherein the photo resist pattern, before the reflowing, does not overlap the first layer.

2. The method of claim 1, wherein the thermal process is performed at a temperature in a range from 150° C. to 200° C.

3. The method of claim 1, wherein the thermal process is performed at a temperature in a range from 170° C. to 180° C.

4. The method of claim 1, wherein the thermal process is performed for a time duration in a range from 30 seconds to 120 seconds.

5. The method of claim 1, wherein the thermal process is performed for a time duration in a range from 40 seconds to 80 seconds.

6. The method of claim 1, wherein:
    after the second layer is formed, a step is formed in the second layer due to an edge of the opening of the first layer, and
    after the photo resist pattern is reflowed, the reflowed photo resist pattern contacts the step.

7. The method of claim 6, wherein after the photo resist pattern is reflowed, the reflowed photo resist pattern fully covers a side wall of the step.

8. The method of claim 7, wherein a slope of a steepest portion of the reflowed photo resist pattern in contact with the side wall is in a range from 10° to 20° with respect to a surface of the substrate.

9. The method of claim 6, wherein:
    the second layer comprises a upper surface and a lower surface connected by the step,
    the photo resist pattern is formed on the lower surface and no photo resist pattern is formed on the upper surface, and
    after the photo resist pattern is reflowed, no reflowed photo resist pattern is disposed on the upper surface.

10. The method of claim 1, wherein a distance between an edge of the opening of the first layer closest to the photo resist pattern and an edge of the photo resist pattern closest to the edge of the opening of the first layer is in a range from 100 nm to 2000 nm in plan view.

11. The method of claim 1, wherein after the reflowing, the reflowed photo resist pattern overlaps the first layer by an overlap amount.

12. The method of claim 11, wherein the overlap amount is in a range from 10 nm to 200 nm.

13. The method of claim 11, wherein the overlap amount is in a range from 20 nm to 100 nm.

14. The method of claim 1, wherein after the reflowing, the reflowed photo resist pattern is spaced apart from the first layer by a distance in plan view.

15. The method of claim 14, wherein the distance is in a range from 10 nm to 200 nm.

16. The method of claim 14, wherein the distance is in a range from 20 nm to 100 nm.

17. The method of claim 1, wherein after the etch-back operation, a protrusion of the second layer having a height in a range from 10 nm to 100 nm is formed.

18. The method of claim 17, wherein the protrusion is asymmetric in a cross section.

19. A method of manufacturing a semiconductor device, the method comprising:
    forming a first layer having first layer patterns and an opening surrounded by the first layer patterns over a substrate;
    forming a second layer over the first layer and the substrate;
    forming a photo resist pattern over the second layer above the opening of the first layer;
    reflowing the photo resist pattern by a thermal process; and
    performing an etch-back operation to planarize the second layer,
    wherein the photo resist pattern has a rectangular shape having a long side and a short side,
    a distance between the long side and one of the first layer pattern facing the long side is greater than a distance between the short side and one of the first layer pattern facing the short side.

20. A method of manufacturing a semiconductor device, the method comprising:
    forming a plurality of first metal wiring patterns over a first dielectric layer;
    forming a second dielectric layer over the plurality of first metal wiring patterns;
    forming a photo resist pattern over the second dielectric layer;
    reflowing the photo resist pattern by a thermal process;
    performing an etch-back operation to planarized the second dielectric layer; and
    forming a plurality of second metal wiring patterns over the planarized second dielectric layer, wherein the photo resist pattern is formed over the second dielectric layer at a region under which no first metal wiring pattern is formed.

* * * * *